United States Patent [19]

Hattori et al.

[11] 3,929,531

[45] Dec. 30, 1975

[54] METHOD OF MANUFACTURING HIGH BREAKDOWN VOLTAGE RECTIFIERS

[75] Inventors: Hirotsugu Hattori; Yuichiro Takayama, both of Takatsuki, Japan

[73] Assignee: Matsushita Electronics Corporation, Osaka, Japan

[22] Filed: May 14, 1973

[21] Appl. No.: 360,080

[30] Foreign Application Priority Data

May 19, 1972 Japan .............................. 47-51435

[52] U.S. Cl. ......................... 156/3; 29/580; 29/583; 156/6; 156/7; 156/17; 252/79.3

[51] Int. Cl.$^2$ ................ H01L 21/304; H01L 21/306

[58] Field of Search ...................... 156/3, 7, 17, 2, 6; 252/79.3; 29/580, 583

[56] References Cited

UNITED STATES PATENTS

| | | | |
|---|---|---|---|
| 3,231,422 | 1/1966 | Emeis | 156/17 |
| 3,597,289 | 8/1971 | Köhl et al. | 156/17 |
| 3,627,598 | 12/1971 | McDonald et al. | 156/17 |
| 3,656,228 | 4/1972 | Glass | 152/2 |
| 3,666,548 | 5/1972 | Brack et al. | 156/7 |
| 3,689,993 | 9/1972 | Tolar | 29/580 |
| 3,706,129 | 12/1972 | McCann | 29/580 |
| 3,775,200 | 11/1973 | de Noble et al. | 156/17 |
| 3,791,948 | 2/1974 | Dixon et al. | 156/7 |
| 3,859,127 | 1/1975 | Lehner | 156/17 |

*Primary Examiner*—Douglas J. Drummond
*Assistant Examiner*—Jerome W. Massie
*Attorney, Agent, or Firm*—Stevens, Davis, Miller & Mosher

[57] ABSTRACT

A method of manufacturing rectifying device by cutting a lamination of semiconductor wafers each having a P-N junction formed therein along planes perpendicular to the plane of the wafer and subjecting the resultant divided series diode laminations to an etching treatment with a blend etching liquid composed of hydrogen fluoride, nitric acid and acetic acid. The etching liquid strongly acts upon the N-type region, while it weakly acts upon the P-type region, so that a configuration similar to that which would be obtained through a positive bevel treatment may be obtained. Thus, it is possible to obtain a high breakdown voltage rectifier which is hardly subject to destruction due to a transient reverse voltage.

2 Claims, 3 Drawing Figures

METHOD OF MANUFACTURING HIGH BREAKDOWN VOLTAGE RECTIFIERS

This invention relates to a method of manufacturing a high breakdown voltage rectifier comprising a lamination of a number of diodes connected in series.

It has been well known in the art to obtain rectifiers capable of withstanding very high voltages by connecting a plurality of diodes each having a predetermined breakdown voltage in series.

The processibility of producing such series diode connections, however, would be very low if the individual diodes are connected to one another after preparing them separately. The drawback in such method would be particularly pronounced when producing a rectifier having a breakdown voltage exceeding several 10 kilovolts since in such case an extraordinarily large number of diodes are laminated.

To obviate this problem, there has been proposed a method of obtaining rectifiers having a form of a square bar consisting of a plurality of series diodes by laminating a required number of semiconductor wafers each having a P-N junction formed therein and cutting the lamination along planes perpendicular to the principal surface of the semiconductor wafers.

Figure 1:
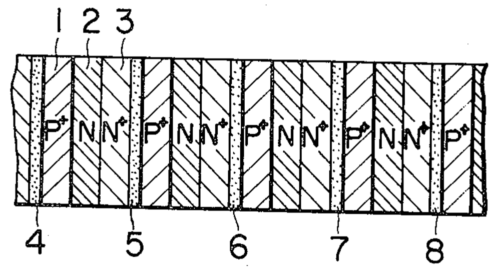
FIG. 1 PRIOR ART
FIG. 1 is sectional view showing an eventual high breakdown voltage rectifier prior to etching treatment.

FIG. 1 shows a sectional view of a rectifier in the above-mentioned method. The illustrated structure consists of a plurality of diodes each having a so-called P-I-N structure having $P^+$-type region 1, N-type region 2 and $N^+$-type region 3, these diodes being connected in series through a solder as indicated at 4, 5, 6, 7 and 8.

The rectifying element cut in this way cannot provide practically useful characteristics because of such problems as mechanical distortions and contaminations at the time of cutting. Therefore, it is necessary to chemically etch the cutting surface.

Figure 2:
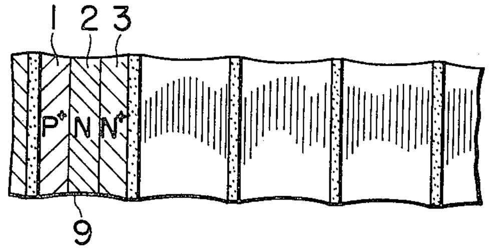
FIG. 2 PRIOR ART
FIG. 2 shows a high breakdown voltage rectifier with the surface thereof etched according to a prior art method.

FIG. 2 shows a configuration of a rectifier having undergone an etching treatment. The etching surface 9 is usually curved as is shown. In this case, a blend liquid composed of fluoric acid and nitric acid is used as etching liquid.

In order for a rectifier to be capable of operating without undergoing destruction against a transient reverse voltage it is necessary that an avalanche characteristic is present in each component diode. However, the diode having the etching surface as shown in FIG. 2 has no avalanche characteristics. The avalanche characteristics can be provided to the individual component diodes by providing a beveling treatment to each diode. Doing so, however, it is practically infeasible for the lamination of a number of diodes as shown in FIG. 1.

The present invention aims to give a solution to the above problem, and its object is to provide a method of manufacturing high breakdown voltage rectifiers comprising a lamination of diodes each having on all sides thereof an inclined or bevel surface like that which would be obtained through a beveling treatment.

According to the invention, it is possible to obtain a high breakdown voltage rectifier which would be destroyed with difficulty transient reverse voltage.

The invention will now be described.

Figure 3:
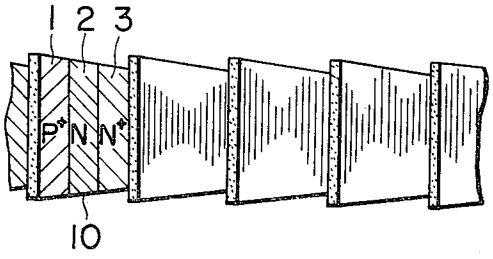
FIG.3 shows a high breakdown voltage rectifier with the surface thereof etched according to the method of the invention.

In the method according to the invention, the divided lamination as shown in FIG. 1 is subsequently immersed in an etching liquid composed of a mixture of hydrofluoric acid (HF), nitric acid ($HNO_3$) and acetic acid ($CH_3COOH$). This etching liquid most strongly acts upon the $N^+$-type region, while it most weakly acts upon the $P^+$-type region. Thus, after the etching each diode constituting the lamination is flared from the $N^+$-type region 3 toward the $P^+$-type region 1 as shown in FIG. 3.

In other words, the resultant etching surface 10 is similar to that which would be obtained through a beveling treatment.

An example of the invention will be given in the following.

An etching liquid composed of hydrofluoric acid with a concentration of about 48 weight percent, nitric acid with a specific gravity of 1.420 and glacial acetic acid in volume ratio of 2 : 4 : 1 was prepared and held at normal temperature, and the afore-mentioned lamination was immersed in this liquid for a period of 80 to 120 seconds.

With this etching treatment the surface of the diode was etched from 70 to 100 microns.

This extent of etching was not only sufficient to remove mechanical distortions and contaminations introduced at the time of mechanical processing, but also each diode had a bevel surface with an etching depth difference of 10 to 60 microns between the boundary between $N^+$-type region and N-type region and the boundary between N-type region and $P^+$-type region, that is, P-N junction.

As has been described in the foregoing, with the high breakdown voltage rectifier manufactured by the method according to the invention all the constituent diodes have beveled surfaces on all sides, so that each diode has an avalanche characteristics.

Thus, it is possible to obtain a high breakdown voltage rectifier which would be destroyed with difficulty by a transient reverse voltage.

What we claim is:

1. A method of manufacturing high breakdown voltage rectifiers comprising the steps of cutting a silicon wafer lamination consisting of a plurality of silicon wafers each having a P-N junction formed therein along planes perpendicular to the principal surface of the silicon wafers into slices of the laminated block, each of said slices of the laminated block consisting of a plurality of diodes connected in series, and subjecting said slices of the laminated block to an etching treatment with a blend etching liquid composed of hydrofluoric acid with a concentration of about 48 weight percent, nitric acid with a specific gravity of 1.420 and glacial acetic acid in a volume ratio of 2:4:1, thereby rendering each of said plurality of diodes into a bevel diode.

2. The method according to claim 1, wherein the etching time is within 80 to 120 seconds.

* * * * *